US012663495B2

(12) United States Patent
Kim

(10) Patent No.: US 12,663,495 B2
(45) Date of Patent: Jun. 23, 2026

(54) PROBE CARD TEST SYSTEM AND METHOD

(71) Applicant: SEMES CO., LTD.,
Chungcheongnam-do (KR)

(72) Inventor: Harkryong Kim, Chungcheongnam-do
(KR)

(73) Assignee: SEMES CO., LTD.,
Chungcheongnam-Do (KR)

( * ) Notice: Subject to any disclaimer, the term of this
patent is extended or adjusted under 35
U.S.C. 154(b) by 223 days.

(21) Appl. No.: 18/734,009

(22) Filed: Jun. 5, 2024

(65) Prior Publication Data

US 2025/0020750 A1     Jan. 16, 2025

(30) Foreign Application Priority Data

Jul. 10, 2023     (KR) ........................ 10-2023-0089117

(51) Int. Cl.
G01R 35/00          (2006.01)
G01N 21/88          (2006.01)

(52) U.S. Cl.
CPC ............. G01R 35/00 (2013.01); G01N 21/88
(2013.01)

(58) Field of Classification Search
CPC .................................. G01R 35/00; G01N 21/88
See application file for complete search history.

(56) References Cited

U.S. PATENT DOCUMENTS 5,374,888 A * 12/1994 Karasawa .......... G01R 1/07314
                                                      414/941
5,404,111 A *  4/1995 Mori .................. G01R 1/07314
                                                      324/754.07
2007/0257686 A1* 11/2007 Beijert ............... G01R 31/2886
                                                      324/750.01

FOREIGN PATENT DOCUMENTS

KR    10-2010-0109191 A    10/2010
KR    10-2013-0093262 A     8/2013
KR    10-2018-0135580 A    12/2018

* cited by examiner

*Primary Examiner* — Paresh Patel
(74) *Attorney, Agent, or Firm* — Carter, DeLuca & Farrell
LLP

(57)          ABSTRACT

Provided is a probe card test system and method, the probe
card test system including a loader for loading and placing
a probe card for testing electrical properties of a substrate,
on a holder, an inverter for transferring the probe card placed
on the holder, to a preliminary position by inverting the
probe card, a transferer for transferring the probe card
transferred to the preliminary position, to a test table, a test
table mover for precisely moving the test table in a first
direction to test probe pins of the probe card, an optical
system for optically testing the probe pins of the probe card,
and an optical system mover for precisely moving the
optical system or the test table in a second direction per-
pendicular to the first direction, to test all the probe pins of
the probe card.

20 Claims, 14 Drawing Sheets

PROBE CARD TEST SYSTEM AND METHOD

CROSS-REFERENCE TO RELATED PATENT APPLICATION

This application claims the benefit of Korean Patent Application No. 10-2023-0089117, filed on Jul. 10, 2023, in the Korean Intellectual Property Office, the disclosure of which is incorporated herein in its entirety by reference.

BACKGROUND OF THE INVENTION

1. Field of the Invention

The present invention relates to a probe card test system and method and, more particularly, to a probe card test system and method capable of automating a series of processes for testing probe pins of a probe card.

2. Description of the Related Art

In general, semiconductor devices such as integrated circuit devices may be formed by repeatedly performing a series of semiconductor processes on a substrate such as a semiconductor wafer. For example, semiconductor circuit devices, i.e., dies, may be formed on a substrate by repeatedly performing a deposition process for depositing a thin film on a wafer, an etching process for etching the thin film into patterns having electrical properties, an ion implantation or diffusion process for implanting or diffusing impurities into the patterns, and a cleaning and rinsing process for removing the impurities from the wafer having the patterns.

After the dies are formed through the series of processes, a test process may be performed to test the electrical properties of the dies. The test process may be performed by a probe station including a probe card having a plurality of probe pins, and a tester connected to the probe card to provide an electrical signal.

The probe card may be detachably mounted at an upper portion of a test chamber, and a stage for supporting the wafer may be disposed under the probe card. The stage may be configured to move in vertical and horizontal directions so as to bring the dies into contact with the probe pins of the probe card.

In the test process, the probe pins of the probe card are brought into contact with the wafer and then a test signal output from the tester is applied to the wafer through the probe pins.

Because the probe pins of the probe card are brought into contact with the wafer to apply the test signal as described above, the probe pins may be worn due to friction with the wafer. When the probe pins are severely worn, the probe card may not be used for the test process and needs to be replaced.

Therefore, the arrangement, height, or abrasion of the probe pins should be managed to determine whether to replace the probe card.

Normally, probe cards are tested based on a manual method in which a user turns over each probe card by hand and checks probe pins with a microscope or a camera.

However, according to the existing manual probe card test method, difficulties may occur due to a gradual increase in diameter or weight of the probe cards beyond the human capability of transportation, and the probe cards which are generally stacked on one another in a waiting area with the probe pins facing downward may not be easily inverted for the test.

In addition, because the existing manual probe card test method requires a long time, a large quantity of probe cards may not be tested using a short waiting time of the probe cards stored in the waiting area, and thus defects of the probe pins may not be prevented in advance before a wafer test.

The existing manual probe card test method is often used because an automated test system capable of testing probe cards of various diameters may not be easily mechanically configured.

SUMMARY OF THE INVENTION

The present invention provides a probe card test system and method capable of automating a series of test processes to rapidly and accurately test not only small-diameter but also large-diameter probe cards, of testing a large quantity of probe cards by using a short waiting time of the probe cards stored in a waiting area, so as to prevent defects of probe pins in advance before a wafer test, and of testing probe cards of various diameters. However, the scope of the present invention is not limited thereto.

According to an aspect of the present invention, there is provided a probe card test system including a loader for loading and placing a probe card for testing the electrical properties of a substrate, on a holder, an inverter for transferring the probe card placed on the holder, to a preliminary position by inverting the probe card, a transferer for transferring the probe card transferred to the preliminary position, to a test table, a test table mover for precisely moving the test table in a first direction to test probe pins of the probe card, an optical system for optically testing the probe pins of the probe card, and an optical system mover for precisely moving the optical system or the test table in a second direction perpendicular to the first direction, to test all the probe pins of the probe card.

The inverter may include a first clamp head for clamping two sides of the probe card placed on the holder with the probe pins facing downward, and a rotating arm connected to the first clamp head at an end and to a rotating shaft at another end and rotating around the rotating shaft to invert the first clamp head such that the probe pins of the probe card face upward.

The first clamp head may include a first head body provided to correspond to the probe card, a first finger provided to move forward or backward on a portion of the first head body so as to be in contact with a first portion of the probe card, and a second finger provided to move forward or backward on another portion of the first head body so as to be in contact with a second portion of the probe card.

The first finger may include a first horizontal portion provided in a shape corresponding to a portion of a top surface of the first head body to slide along the first head body, a first vertical portion connected to the first horizontal portion to move toward or away from the first portion of the probe card, and a first recessed portion provided in a surface of the first vertical portion facing the probe card and provided in a concave or arc shape to correspond to the first portion of the probe card, and the second finger may include a second horizontal portion provided in a shape corresponding to another portion of the top surface of the first head body to slide along the first head body, a second vertical portion connected to the second horizontal portion to move toward or away from the second portion of the probe card, and a second recessed portion provided in a surface of the second vertical portion facing the probe card and provided in a concave or arc shape to correspond to the second portion of the probe card.

The first clamp head may further include a pin pusher for pushing a pin toward a pinhole provided in the probe card to fix the probe card, and the pin pusher may include the pin provided in a shape corresponding to the pinhole provided in the probe card so as to be insertable into the pinhole, and provided to move forward or backward through a through-hole provided in the first head body, an elastic member for applying a restoring force in a direction in which the pin moves backward, and a cam protrusion mounted on a surface of the first horizontal portion facing the pin so as to press the pin forward depending on a position to which the first finger slides.

To fix probe cards of various diameters depending on a slide position of the first finger, the pin pusher may include a first pin pusher mounted at a first slide position, and a second pin pusher mounted at a second slide position different from the first slide position.

The transferer may include a second clamp head for clamping other two sides of the probe card transferred to the preliminary position so as not to interfere with the first clamp head of the inverter, a first movable plate connected to the second clamp head and capable of reciprocating to transfer the second clamp head from the preliminary position to the test table, and a first rail mounted above the second clamp head to guide the first movable plate in the first direction.

The second clamp head may include a second head body provided to correspond to the probe card, a third finger provided to move forward or backward on a portion of the second head body so as to be in contact with a third portion of the probe card, and a fourth finger provided to move forward or backward on another portion of the second head body so as to be in contact with a fourth portion of the probe card.

The third finger may include a third horizontal portion provided in a shape corresponding to a portion of a top surface of the second head body to slide along the second head body, a third vertical portion connected to the third horizontal portion to move toward or away from the third portion of the probe card, and a third recessed portion provided in a surface of the third vertical portion facing the probe card and provided in a concave or arc shape to correspond to the third portion of the probe card, and the fourth finger may include a fourth horizontal portion provided in a shape corresponding to another portion of the top surface of the second head body to slide along the second head body, a fourth vertical portion connected to the fourth horizontal portion to move toward or away from the fourth portion of the probe card, and a fourth recessed portion provided in a surface of the fourth vertical portion facing the probe card and provided in a concave or arc shape to correspond to the fourth portion of the probe card.

A first virtual line which connects the first and second portions of the probe card may pass through a center point of the probe card, and a second virtual line which connects the third and fourth portions of the probe card may pass through the center point of the probe card perpendicularly to the first virtual line.

The first virtual line may extend in a direction which is the same as the first direction, and the second virtual line may extend in a direction which is the same as the second direction.

The transferer may further include a lift provided between the second clamp head and the first movable plate to raise or lower the second clamp head.

The test table mover may include a second movable plate connected to the test table and capable of reciprocating from a first test position to a second test position, a second rail mounted under the second movable plate to guide the second movable plate in the first direction, and a base for supporting the second rail.

The optical system may include a scan test camera for scan-testing the probe pins of the probe card at a low magnification, and a precise test camera disposed next to the scan test camera to precisely test the probe pins, which require a precise test, at a high magnification.

The precise test camera may be at least partially raised or lowered to move a focus.

The optical system mover may include a third movable plate connected to the optical system and capable of reciprocating from a first imaging position to a second imaging position, a third rail for guiding the third movable plate in the second direction, and a base for supporting the third rail.

The holder may substantially have a ring shape or a short pipe shape with a hollow to protect the probe pins provided on a bottom surface of the probe card.

The loader may be a loader/unloader for unloading the probe card which has been completely tested and returned to the holder through the transferer and the inverter.

According to another aspect of the present invention, there is provided a probe card test method including (a) loading and placing a probe card for testing electrical properties of a substrate, on a holder, (b) transferring the probe card placed on the holder, to a preliminary position by inverting the probe card, (c) transferring the probe card transferred to the preliminary position, to a test table, (d) precisely moving the test table in a first direction to test probe pins of the probe card, (e) testing the probe pins of the probe card by using an optical system, and (f) precisely moving the optical system or the test table in a second direction perpendicular to the first direction, to test all the probe pins of the probe card.

According to another aspect of the present invention, there is provided a probe card test system including a loader for loading and placing a probe card for testing electrical properties of a substrate, on a holder, an inverter for transferring the probe card placed on the holder, to a preliminary position by inverting the probe card, a transferer for transferring the probe card transferred to the preliminary position, to a test table, a test table mover for precisely moving the test table in a first direction to test probe pins of the probe card, an optical system for optically testing the probe pins of the probe card, and an optical system mover for precisely moving the optical system or the test table in a second direction perpendicular to the first direction, to test all the probe pins of the probe card, wherein the inverter includes a first clamp head for clamping two sides of the probe card placed on the holder with the probe pins facing downward, and a rotating arm connected to the first clamp head at an end and to a rotating shaft at another end and rotating around the rotating shaft to invert the first clamp head such that the probe pins of the probe card face upward, wherein the first clamp head includes a first head body provided to correspond to the probe card, a first finger provided to move forward or backward on a portion of the first head body so as to be in contact with a first portion of the probe card, and a second finger provided to move forward or backward on another portion of the first head body so as to be in contact with a second portion of the probe card, wherein the first finger includes a first horizontal portion provided in a shape corresponding to a portion of a top surface of the first head body to slide along the first head body, a first vertical portion connected to the first horizontal portion to move toward or away from the first portion of the probe card, and a first recessed portion provided in a surface of the first vertical portion facing the probe card and provided in a concave or arc shape to correspond to the first portion of the probe card, wherein the second finger includes a second horizontal portion provided in a shape corresponding to another portion of the top surface of the first head body to slide along the first head body, a second vertical portion connected to the second horizontal portion to move toward or away from the second portion of the probe card, and a second recessed portion provided in a surface of the second vertical portion facing the probe card and provided in a concave or arc shape to correspond to the second portion of the probe card, wherein the first clamp head further includes a pin pusher for pushing a pin toward a pinhole provided in the probe card to fix the probe card, wherein the transferer includes a second clamp head for clamping other two sides of the probe card transferred to the preliminary position so as not to interfere with the first clamp head of the inverter, a first movable plate connected to the second clamp head and capable of reciprocating to transfer the second clamp head from the preliminary position to the test table, and a first rail mounted above the second clamp head to guide the first movable plate in the first direction, wherein the transferer further includes a lift provided between the second clamp head and the first movable plate to raise or lower the second clamp head, wherein the test table mover includes a second movable plate connected to the test table and capable of reciprocating from a first test position to a second test position, a second rail mounted under the second movable plate to guide the second movable plate in the first direction, and a base for supporting the second rail, wherein the optical system includes a scan test camera for scan-testing the probe pins of the probe card at a low magnification, and a precise test camera disposed next to the scan test camera to precisely test the probe pins, which require a precise test, at a high magnification, wherein the optical system mover includes a third movable plate connected to the optical system and capable of reciprocating from a first imaging position to a second imaging position, a third rail for guiding the third movable plate in the second direction, and a base for supporting the third rail, and wherein the holder substantially has a ring shape or a short pipe shape with a hollow to protect the probe pins provided on a bottom surface of the probe card.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
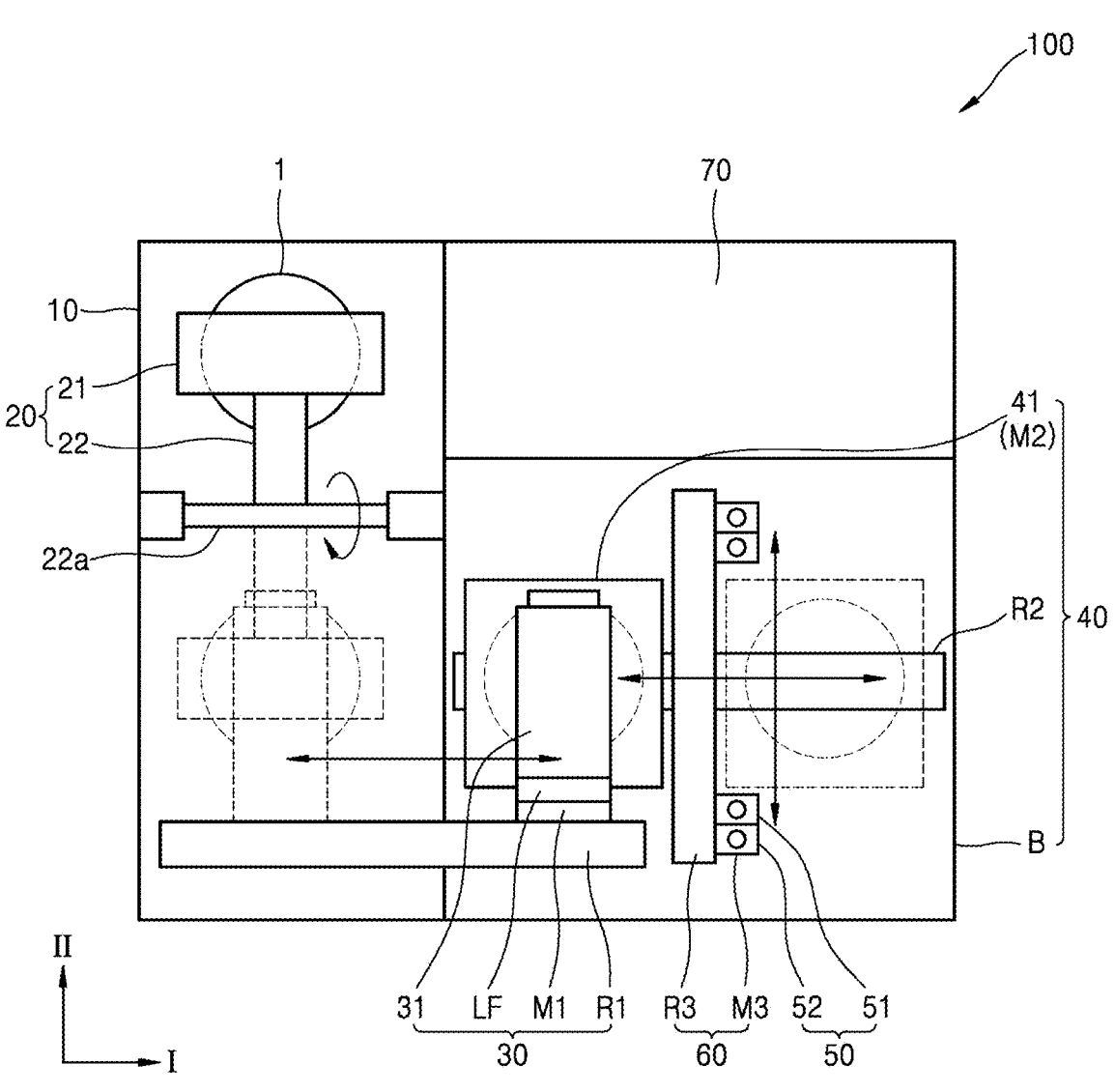
FIG. 1 is a plan view of a probe card test system according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, components, and/or groups thereof, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
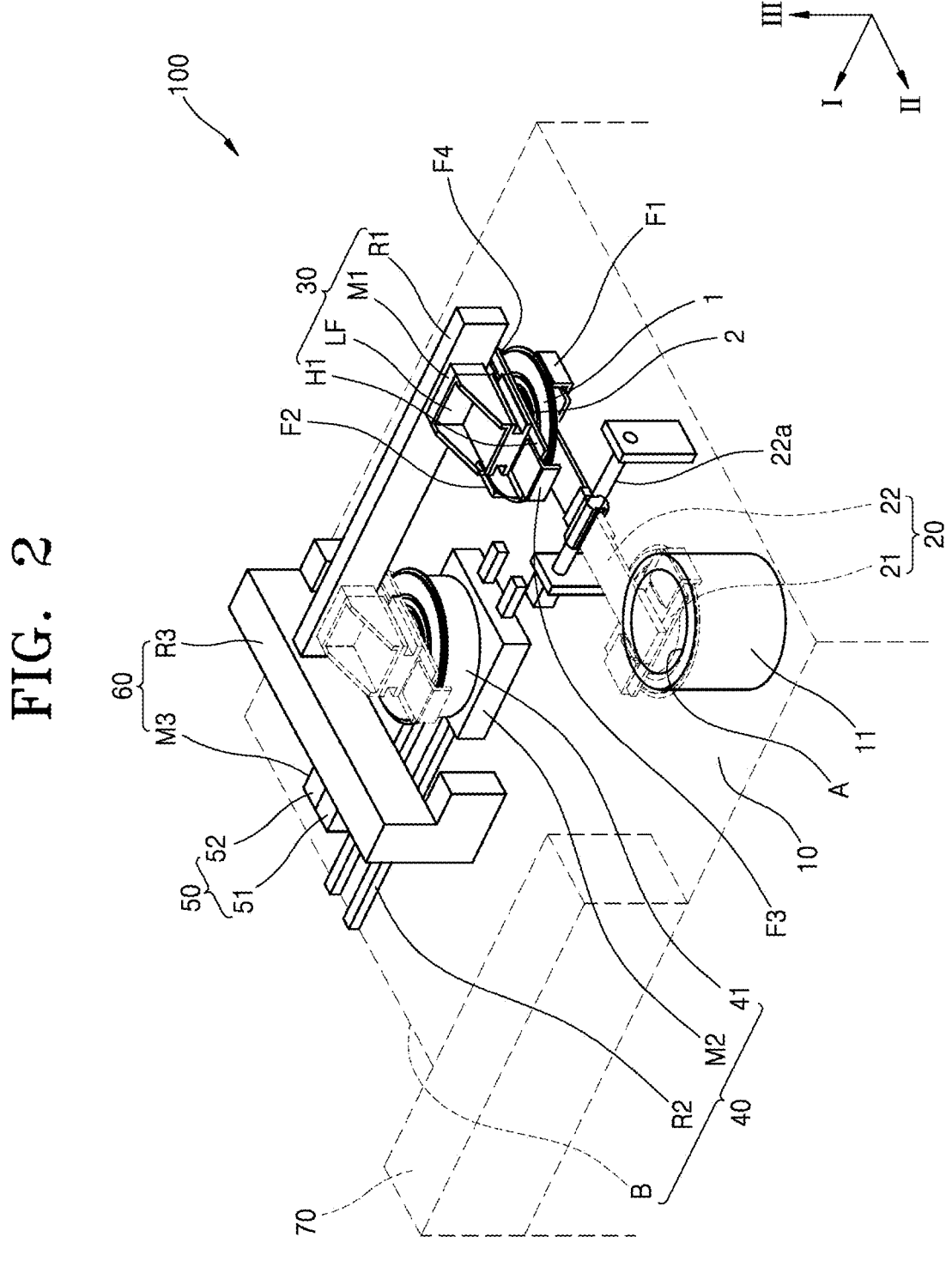
FIG. 2 is a perspective view of the probe card test system of FIG. 1.

FIG. 1 is a plan view of a probe card test system 100 according to some embodiments of the present invention, and FIG. 2 is a perspective view of the probe card test system 100 of FIG. 1.

Initially, as shown in FIGS. 1 and 2, the probe card test system 100 according to some embodiments of the present invention may mainly include a base B, a loader 10, an inverter 20, a transferer 30, a test table mover 40, an optical system 50, an optical system mover 60, and a controller 70.

The base B may be provided to a certain height from the floor and may be a frame structure with sufficient strength and durability to support the loader 10, the inverter 20, the transferer 30, the test table mover 40, the optical system 50, the optical system mover 60, and the controller 70.

On the base B, the loader 10, the inverter 20, the transferer 30, the test table mover 40, the optical system 50, and the optical system mover 60 may be sequentially disposed such that a probe card 1 for testing the electrical properties of a substrate such as a wafer or a display board may be loaded on the loader 10 at a side, inverted by the inverter 20, transferred by the transferer 30, and precisely tested by the optical system 50.

The base B may include vertical, horizontal, and panel members in various shapes to support the above-mentioned elements, and is not limited to the illustration and may include various shapes and types of members assembled together to fit in an installation space.

The loader 10 may include a holder 11 on which the probe card 1 is loaded and placed by a transfer robot (not shown) or a user. The holder 11 may substantially have a circular ring shape or a short circular pipe shape with a hollow A to accommodate and protect probe pins 2 provided on a bottom surface of the probe card 1.

In addition to the circular ring shape and the short circular pipe shape, the holder 11 may include supports of various shapes, e.g., a polygonal ring shape, a polygonal pipe shape, or a lift pin shape, to support the flange or the edge of the probe card 1 other than the probe pins 2 of the probe card 1 without interfering with the probe pins 2 provided on the bottom surface of the probe card 1.

Therefore, probe cards 1, which are generally stacked in multiple layers and waiting in a waiting area with the probe pins 2 facing downward, may be safely loaded on the holder 11 of the loader 10 by the transfer robot or the user without damaging the probe pins 2.

In this case, the reason why the probe cards 1 are stacked in multiple layers with the probe pins 2 facing downward in the waiting area such as a stacker is because the probe card 1 is transferred and replaced into the tester while the probe pins 2 are facing downward. In the probe card test system 100 according to some embodiments of the present invention, because the probe card 1 waiting in the waiting area with the probe pins 2 facing downward may be loaded as it is and then automatically inverted, a user does not need to manually invert the heavy probe card 1 and thus the convenience of test may be significantly increased.

The loader 10 may be a loader/unloader for unloading the probe card 1 which has been completely tested and returned to the holder 11 through the transferer 30 and the inverter 20.

However, the loader 10 is not limited to the illustration. For example, the loader 10 may serve only as a loader and an unloader (not shown) may be separately provided. Although not shown in the drawings, the loader 10 may be a stacker (not shown) where the probe card 1 waits and, in this case, the holder 11 may be a holder provided in the stacker and the inverter 20 may directly clamp and invert the probe card 1 waiting on the holder inside the stacker.

The inverter 20 may be a device for transferring the probe card 1 placed on the holder 11 with the probe pins 2 facing downward, to a preliminary position by inverting the probe card 1 such that the probe pins 2 face upward.

The inverter 20 may include a first clamp head 21 for clamping two sides of the probe card 1 placed on the holder 11 with the probe pins 2 facing downward, and a rotating arm 22 connected to the first clamp head 21 at an end and to a rotating shaft 22a at another end and swinging around the rotating shaft 22a to invert the first clamp head 21 such that the probe pins 2 of the probe card 1 face upward.

However, the inverter 20 is not limited to the swinging and may use various rotation methods capable of inverting the probe card 1.

Therefore, the inverter 20 may clamp two sides of the probe card 1 placed on the holder 11 with the probe pins 2 facing downward, by using the first clamp head 21, and swing the rotating arm 22 around the rotating shaft 22a to automatically invert the probe card 1 such that the probe pins 2 of the probe card 1 face upward. Herein, a drive motor or a rotary actuator may be mounted on the rotating shaft 22a of the rotating arm 22 to swing the rotating arm 22.

The transferer 30 may be a device for transferring the probe card 1 inverted and transferred to the preliminary position by the inverter 20, to a test table 41 for a precise test.

The transferer 30 may include a second clamp head 31 for clamping other two sides of the probe card 1 transferred to the preliminary position so as not to interfere with the first clamp head 21 of the inverter 20, a first movable plate M1 connected to the second clamp head 31 and capable of reciprocating to transfer the second clamp head 31 from the preliminary position to the test table 41, and a first rail R1 mounted above the second clamp head 31 to guide the first movable plate M1 in a first direction I.

However, the transferer 30 is not limited to the first movable plate M1 which reciprocates along the first rail R1, and may include various shapes and types of transferers capable of transferring the probe card 1 from the preliminary position to the test table 41.

Therefore, using the transferer 30, other two sides of the probe card 1 transferred to the preliminary position may be clamped not to interfere with the first clamp head 21 of the inverter 20, and the probe card 1 may be transferred from the preliminary position to the test table 41 by the first movable plate M1 capable of reciprocating along the first rail R1.

The test table mover 40 may be a device for precisely moving the test table 41 in the first direction I to test the probe pins 2 of the probe card 1.

The test table mover 40 may include a second movable plate M2 connected to the test table 41 and capable of reciprocating from a first test position to a second test position, a second rail R2 mounted under the second movable plate M2 to guide the second movable plate M2 in the first direction I, and the base B for supporting the second rail R2.

However, the test table mover 40 is not limited to the second movable plate M2 which reciprocates along the second rail R2, and may include various shapes and types of movers capable of precisely moving the probe card 1 in the first direction I.

Therefore, using the test table mover 40, the probe card 1 placed on the test table 41 may be precisely moved from the first test position to the second test position in the first direction I.

The optical system 50 is an optical device for optically testing the probe pins 2 of the probe card 1, and may include a scan test camera 51 for scan-testing the probe pins 2 of the probe card 1 at a low magnification, and a precise test camera 52 disposed next to the scan test camera 51 to precisely test the probe pins 2, which require a precise test, at a high magnification. The precise test camera 52 may be at least partially raised or lowered to move a focus.

However, the optical system 50 is not limited to the scan test camera 51 or the precise test camera 52 and may include various shapes and types of test devices capable of testing the probe pins 2, e.g., a laser scanner or various sensors.

Therefore, using the optical system 50, when defects are found while the probe pins 2 of the probe card 1 are being primarily scan-tested, the probe pins 2 which require a precise test may be secondarily precisely tested by adjusting the magnification.

The optical system mover 60 may be a device for precisely moving the optical system 50 or the test table 41 in a second direction II perpendicular to the first direction I, to test all the probe pins 2 of the probe card 1.

The optical system mover 60 may include a third movable plate M3 connected to the optical system 50 and capable of reciprocating from a first imaging position to a second imaging position, a third rail R3 for guiding the third movable plate M3 in the second direction II, and the base B for supporting the third rail R3.

However, the optical system mover 60 is not limited to the third movable plate M3 which reciprocates along the third rail R3, and may include various shapes and types of movers capable of precisely moving the optical system 50 in the second direction II.

Herein, the first, second, and third directions I, II, and III may be directions perpendicular to each other. For example, the first direction I may be the X-axis direction, the second direction II may be the Y-axis direction, and the third direction III may be the Z-axis direction. However, the directions are not limited to the illustration and may include various directions.

Thus, X and Y coordinates, defects, abrasion, contamination, deformation, two-dimensional (2D) shapes, three-dimensional (3D) shapes, etc. of the probe pins 2 may be accurately checked using the scan test camera 51 or the precise test camera 52 capable of precisely testing the probe pins 2 of the probe card 1.

The controller 70 may include various electronic control devices, e.g., a microprocessor, a central processing unit, a computing unit, a semiconductor chip, an integrated circuit, a printed circuit board, an electronic component, a computer, a server computer, a smartphone, a smart pad, a smart device, a control panel, a control circuit, memory, a storage device having stored programs therein, a command input device, a communication device, or a network device, capable of applying control signals to the loader 10, the inverter 20, the transferer 30, the test table mover 40, the optical system 50, and the optical system mover 60 to automatically perform the above-described series of test processes.

Therefore, by the control of the controller 70, the series of test processes for loading and placing the probe card 1 for testing electrical properties of a substrate, on the holder 11, transferring the probe card 1 placed on the holder 11 to the preliminary position by inverting the probe card 1, transferring the probe card 1 transferred to the preliminary position, to the test table 41, precisely moving the test table 41 in the first direction I to test the probe pins 2 of the probe card 1, testing the probe pins 2 of the probe card 1 by using the optical system 50, precisely moving the optical system 50 or the test table 41 in the second direction II perpendicular to the first direction I, to test all the probe pins 2 of the probe card 1, and returning the probe card 1 having been completely tested to the holder 11 and unloading the probe card 1 may be automatically performed.

Thus, a series of test processes may be automated to rapidly and accurately test not only small-diameter but also large-diameter probe cards 1, a large quantity of probe cards 1 may be tested using a short waiting time of the probe cards 1 stored in a waiting area, and thus defects of the probe pins

2 in arrangement, height, abrasion, or the like may be prevented in advance before a wafer test.

Figure 3:
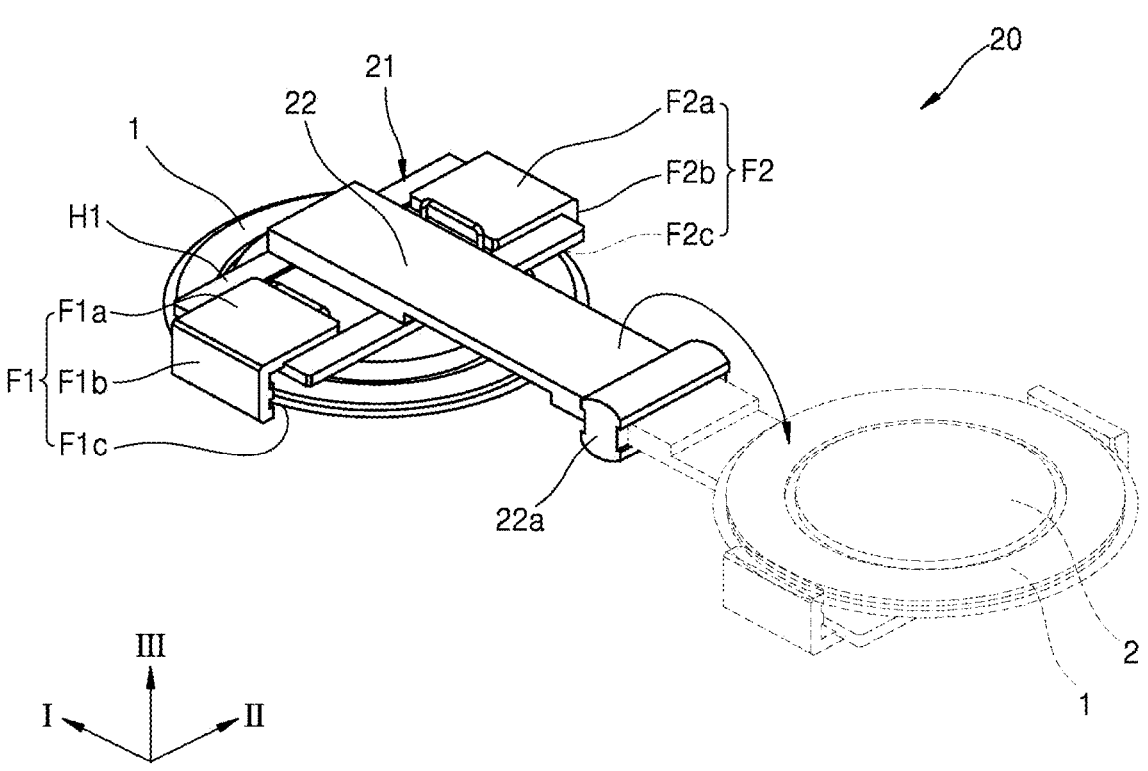
FIG. 3 is a perspective view of an inverter of the probe card test system of FIG. 1.
Figure 4:
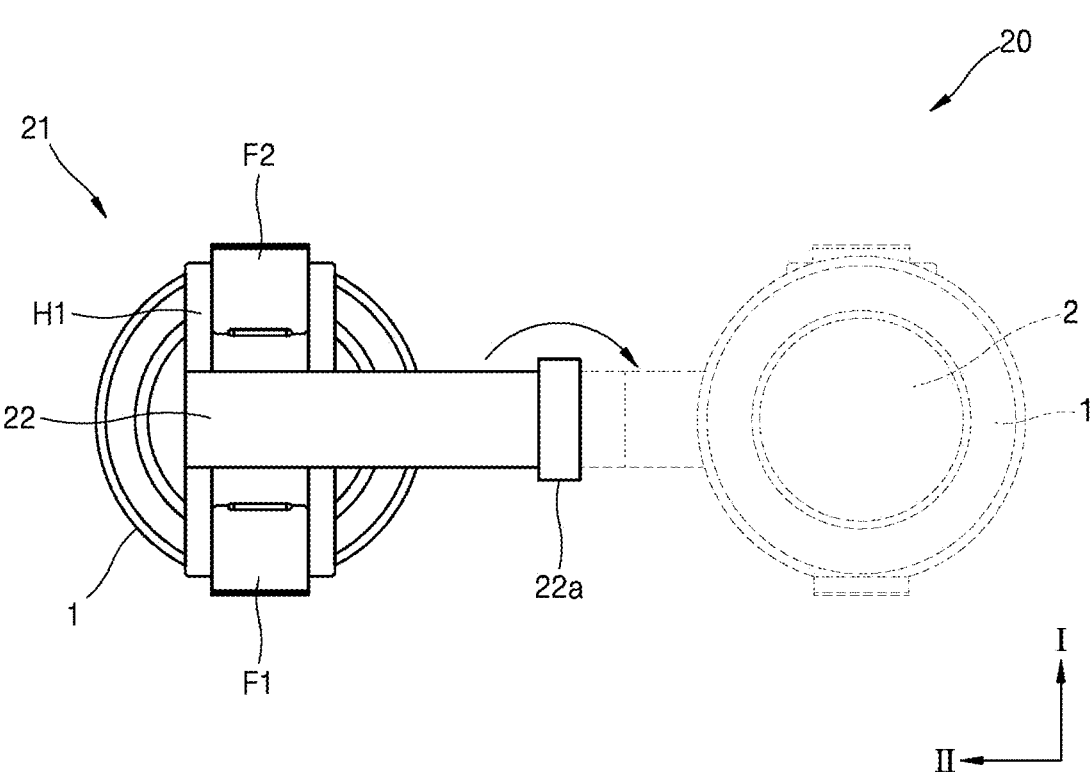
FIG. 4 is a plan view of the inverter of FIG. 3.
Figure 5:
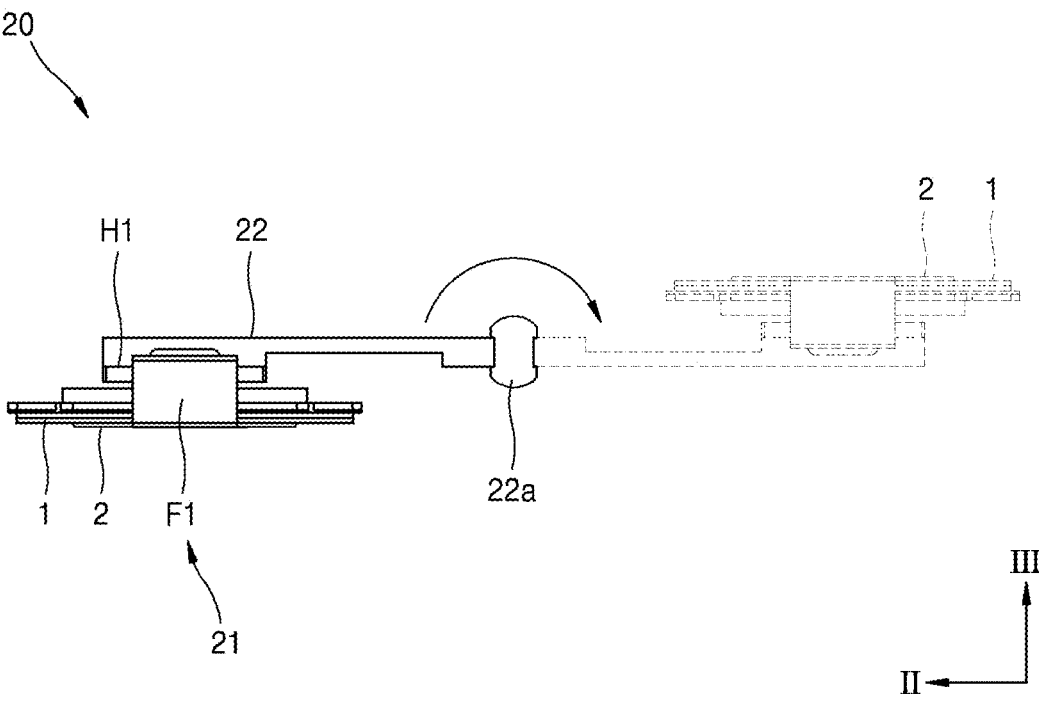
FIG. 5 is a side view of the inverter of FIG. 3.

FIG. 3 is a perspective view of the inverter 20 of the probe card test system 100 of FIG. 1, FIG. 4 is a plan view of the inverter 20 of FIG. 3, and FIG. 5 is a side view of the inverter 20 of FIG. 3.

As shown in FIGS. 1 to 5, the inverter 20 may be a device for transferring the probe card 1 placed on the holder 11 with the probe pins 2 facing downward, to the preliminary position by inverting the probe card 1 such that the probe pins 2 face upward, and include the first clamp head 21 for clamping two sides of the probe card 1 placed on the holder 11 with the probe pins 2 facing downward.

The first clamp head 21 may include a first head body H1 provided to correspond to the probe card 1, a first finger F1 provided to move forward or backward on a portion of the first head body H1 so as to be in contact with a first portion P1 of the probe card 1, and a second finger F2 provided to move forward or backward on another portion of the first head body H1 so as to be in contact with a second portion P2 of the probe card 1.

Figure 6:
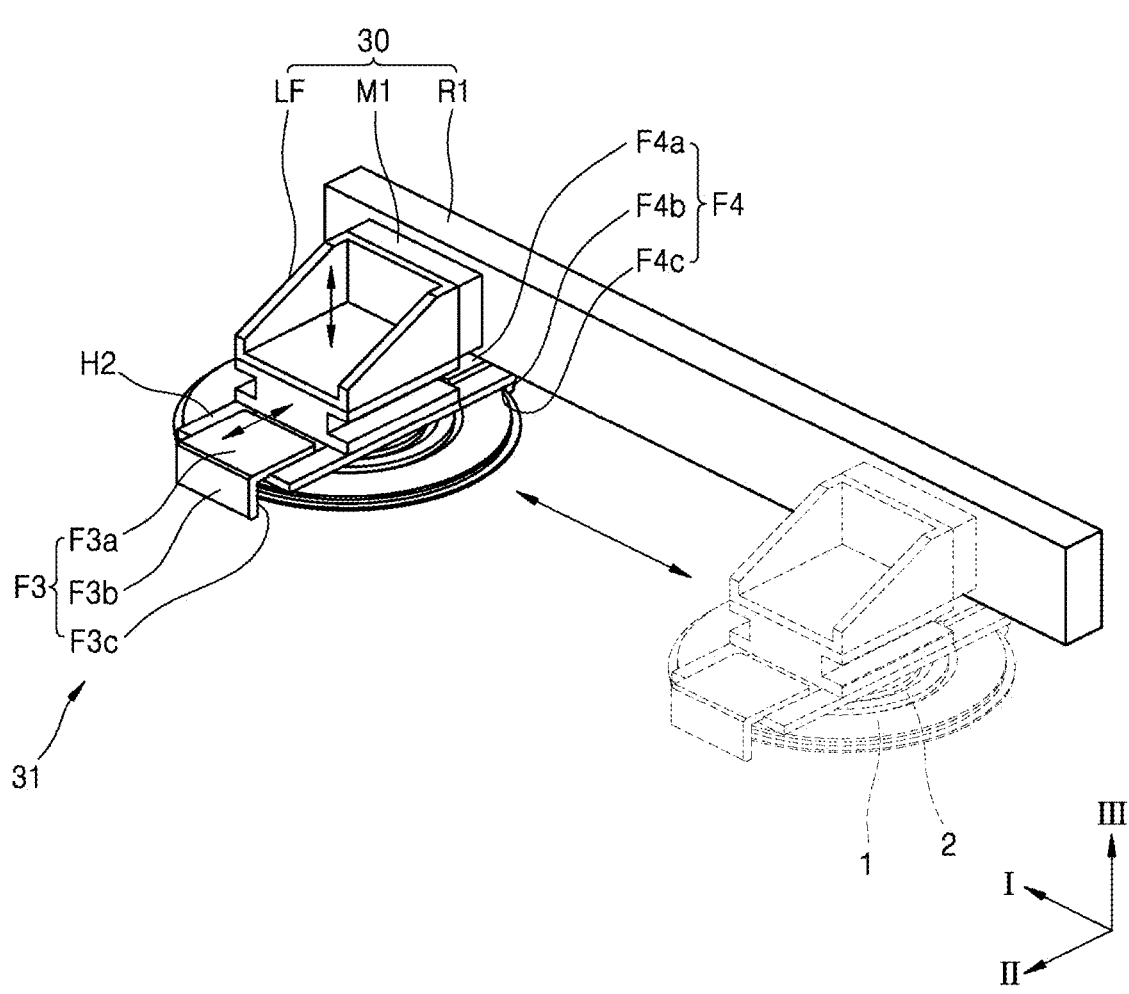
FIG. 6 is a perspective view of a transferer of the probe card test system of FIG. 1.
Figure 7:
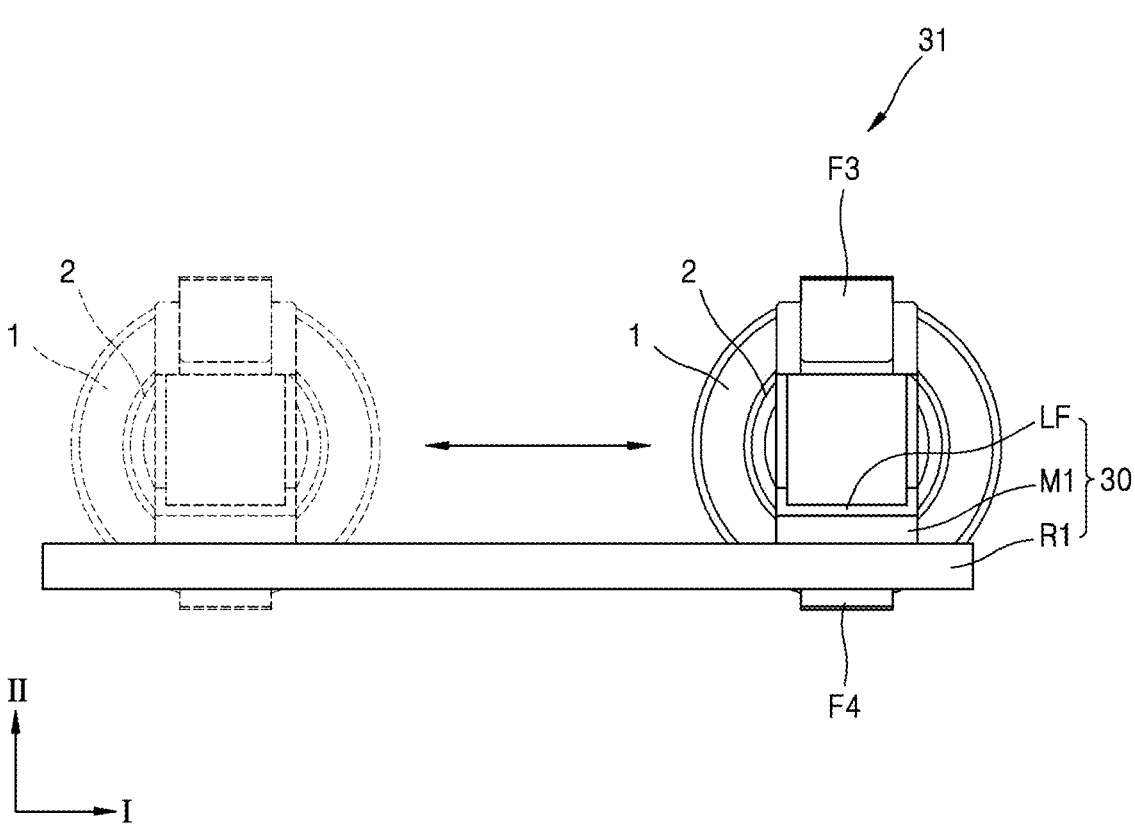
FIG. 7 is a plan view of the transferer of FIG. 6.
Figure 8:
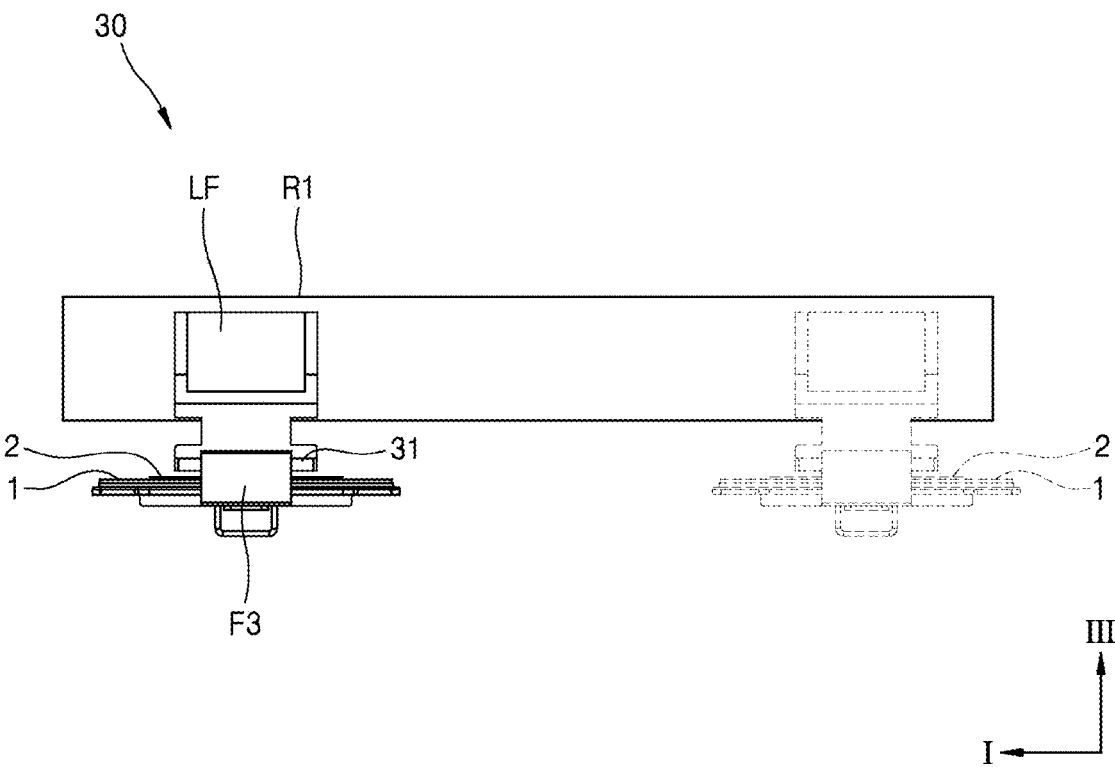
FIG. 8 is a side view of the transferer of FIG. 6.

FIG. 6 is a perspective view of the transferer 30 of the probe card test system 100 of FIG. 1, FIG. 7 is a plan view of the transferer 30 of FIG. 6, and FIG. 8 is a side view of the transferer 30 of FIG. 6.

As shown in FIGS. 1 to 8, the transferer 30 of the probe card test system 100 of FIG. 1 may be a device including the second clamp head 31, the first movable plate M1, and the first rail R1, and may further include a lift LF provided between the second clamp head 31 and the first movable plate M1 to raise or lower the second clamp head 31 having clamped the probe card 1.

Therefore, using the lift LF, the second clamp head 31 may be lowered toward the probe card 1 to clamp the probe card 1, raised and transferred by the first movable plate M1 along the first rail R1, and lowered again to place the probe card 1 on the test table 41.

Figure 9:
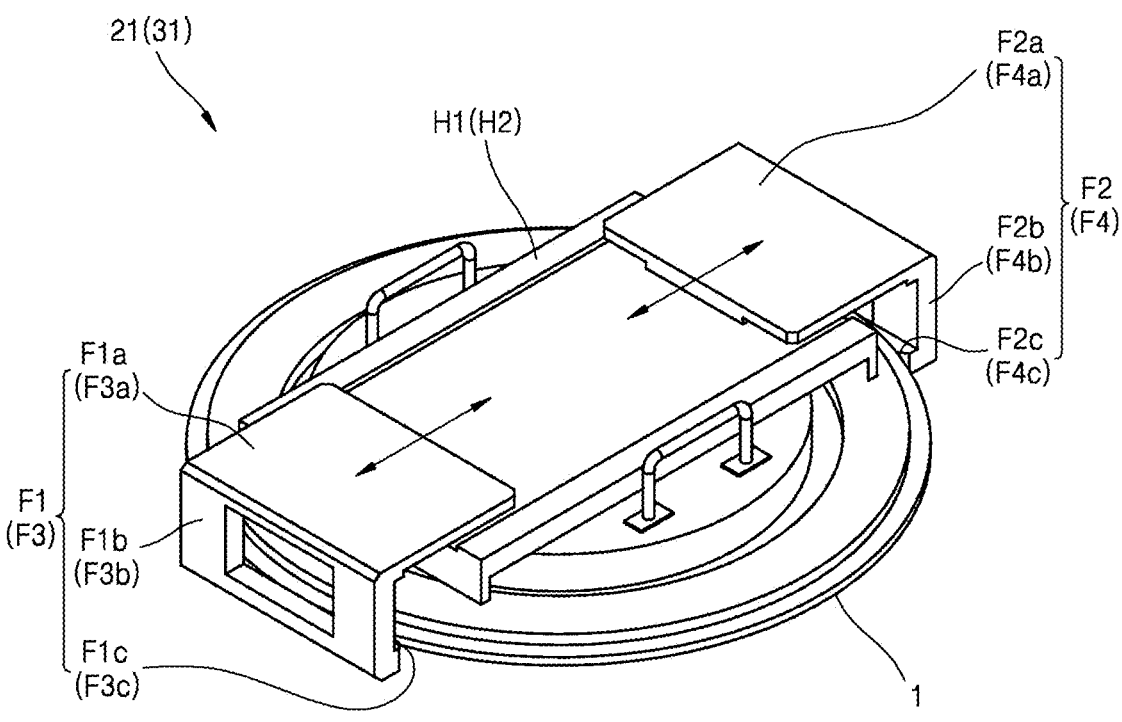
FIG. 9 is a perspective view of a first or second clamp head of the probe card test system of FIG. 1.
Figure 10:
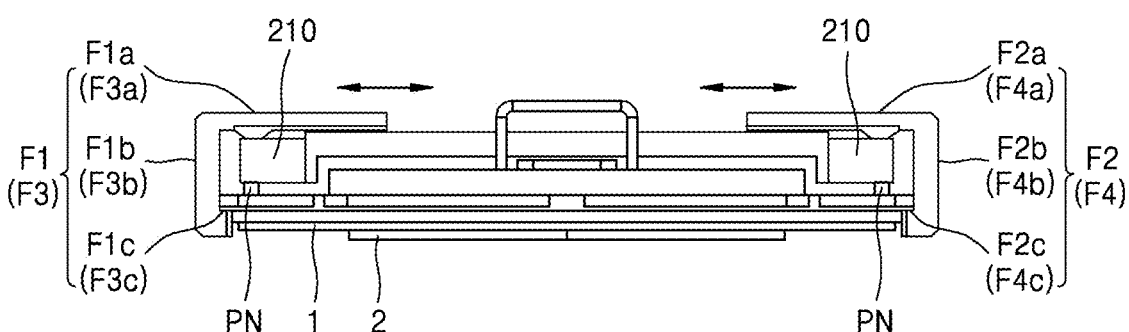
FIG. 10 is a side view of the first or second clamp head of FIG. 9.

FIG. 9 is a perspective view of the first or second clamp head 21 or 31 of the probe card test system 100 of FIG. 1, and FIG. 10 is a side view of the first or second clamp head 21 or 31 of FIG. 9.

As shown in FIGS. 1 to 10, the first clamp head 21 may be structurally the same as or similar to the second clamp head 31.

The first clamp head 21 may be a device for clamping two sides of the probe card 1 placed on the holder 11 with the probe pins 2 facing downward.

The first clamp head 21 may include a first head body H1 provided to correspond to the probe card 1, a first finger F1 provided to move forward or backward on a portion of the first head body H1 so as to be in contact with a first portion P1 of the probe card 1, and a second finger F2 provided to move forward or backward on another portion of the first head body H1 so as to be in contact with a second portion P2 of the probe card 1.

The first finger F1 may include a first horizontal portion F1a provided in a shape corresponding to a portion of a top surface of the first head body H1 to slide along the first head body H1, a first vertical portion F1b connected to the first horizontal portion F1a to move toward or away from the first portion P1 of the probe card 1, and a first recessed portion F1c provided in a surface of the first vertical portion F1b facing the probe card 1 and provided in a concave or arc shape to correspond to the first portion P1 of the probe card 1.

The second finger F2 may include a second horizontal portion F2a provided in a shape corresponding to another portion of the top surface of the first head body H1 to slide along the first head body H1, a second vertical portion F2b connected to the second horizontal portion F2a to move toward or away from the second portion P2 of the probe card 1, and a second recessed portion F2c provided in a surface of the second vertical portion F2b facing the probe card 1 and provided in a concave or arc shape to correspond to the second portion P2 of the probe card 1.

The second clamp head 31 may be a device for clamping other two sides of the probe card 1 located at the preliminary position with the probe pins 2 facing upward.

The second clamp head 31 may be structurally the same as or similar to the first clamp head 21, and include a second head body H2 provided to correspond to the probe card 1, a third finger F3 provided to move forward or backward on a portion of the second head body H2 so as to be in contact with a third portion P3 of the probe card 1, and a fourth finger F4 provided to move forward or backward on another portion of the second head body H2 so as to be in contact with a fourth portion P4 of the probe card 1.

The third finger F3 may include a third horizontal portion F3a provided in a shape corresponding to a portion of a top surface of the second head body H2 to slide along the second head body H2, a third vertical portion F3b connected to the third horizontal portion F3a to move toward or away from the third portion P3 of the probe card 1, and a third recessed portion F3c provided in a surface of the third vertical portion F3b facing the probe card 1 and provided in a concave or arc shape to correspond to the third portion P3 of the probe card 1.

The fourth finger F4 may include a fourth horizontal portion F4a provided in a shape corresponding to another portion of the top surface of the second head body H2 to slide along the second head body H2, a fourth vertical portion F4b connected to the fourth horizontal portion F4a to move toward or away from the fourth portion P4 of the probe card 1, and a fourth recessed portion F4c provided in a surface of the fourth vertical portion F4b facing the probe card 1 and provided in a concave or arc shape to correspond to the fourth portion P4 of the probe card 1.

Figure 11:
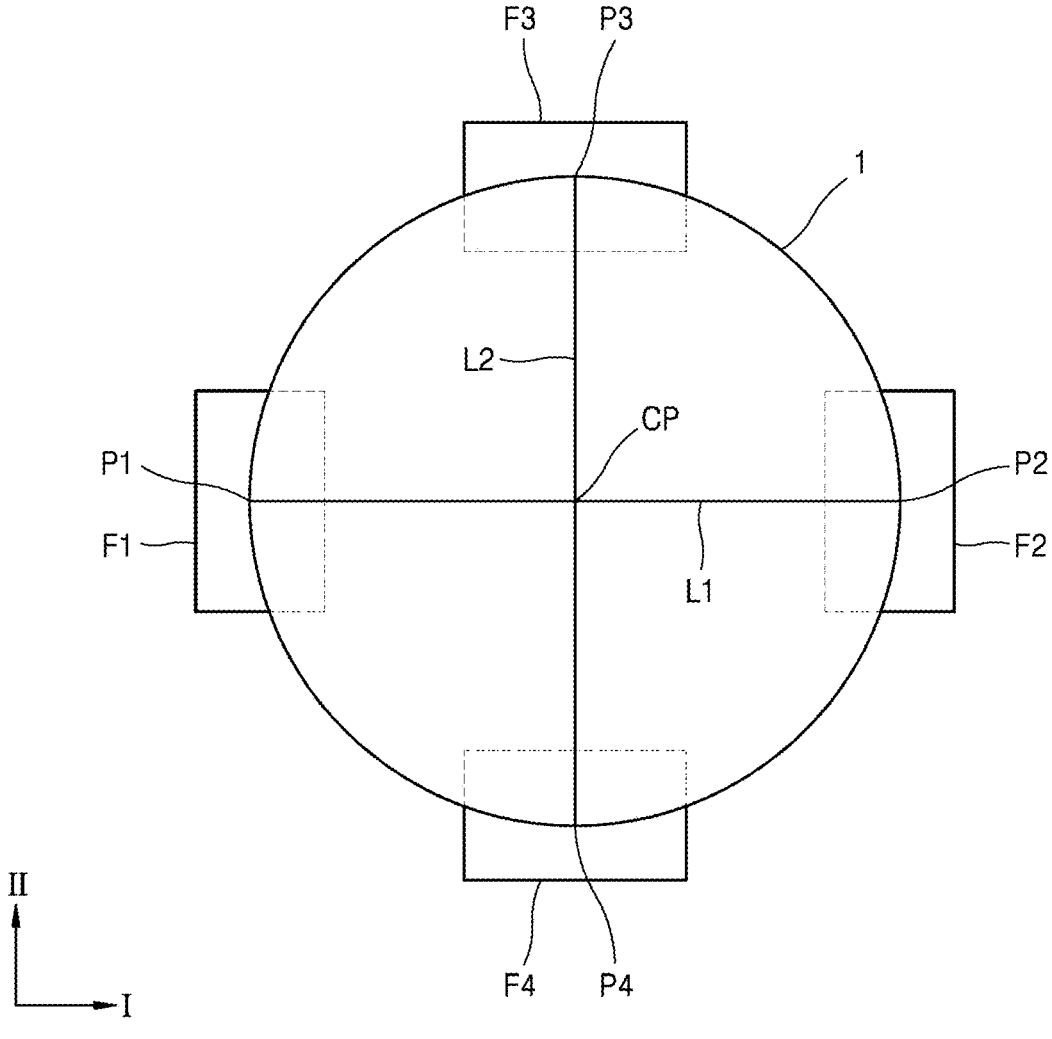
FIG. 11 is a conceptual view showing a clamped state of a probe card at a preliminary position of the probe card test system of FIG. 1.

FIG. 11 is a conceptual view showing a clamped state of the probe card 1 at the preliminary position of the probe card test system 100 of FIG. 1.

As shown in FIGS. 1 to 11, at the preliminary position of the probe card test system 100 of FIG. 1, a first virtual line L1 which connects the first portion P1 of the probe card 1 clamped by the first finger F1 and the second portion P2 of the probe card 1 clamped by the second finger F2 may pass through a center point CP of the probe card 1, and a second virtual line L2 which connects the third portion P3 of the probe card 1 clamped by the third finger F3 and the fourth portion P4 of the probe card 1 clamped by the fourth finger F4 may pass through the center point CP of the probe card 1 perpendicularly to the first virtual line L1.

Herein, the first virtual line L1 may extend in the X-axis direction which is the same as the first direction I, and the second virtual line L2 may extend in the Y-axis direction which is the same as the second direction II.

However, the directions are not limited to the illustration and may include various directions.

As shown in FIG. 10, the first clamp head 21 may further include a pin pusher 210 for pushing a pin PN toward a pinhole PH provided in the probe card 1 to align or firmly fix the probe card 1.

Figure 12:
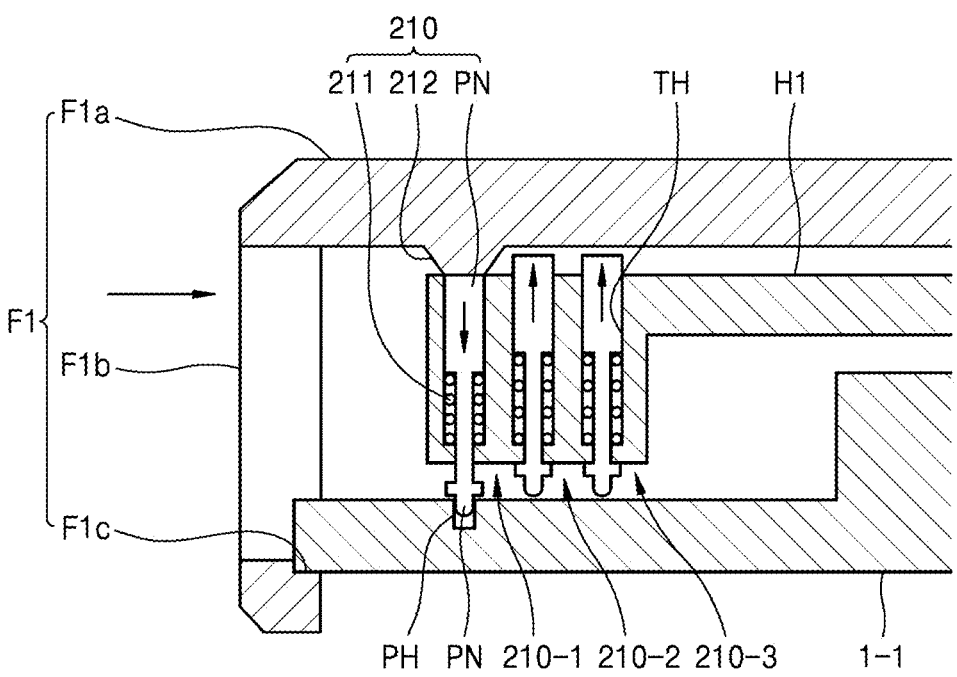
FIG. 12 is a cross-sectional view showing a clamped state of a small-diameter probe card in the probe card test system of FIG. 1.
Figure 13:
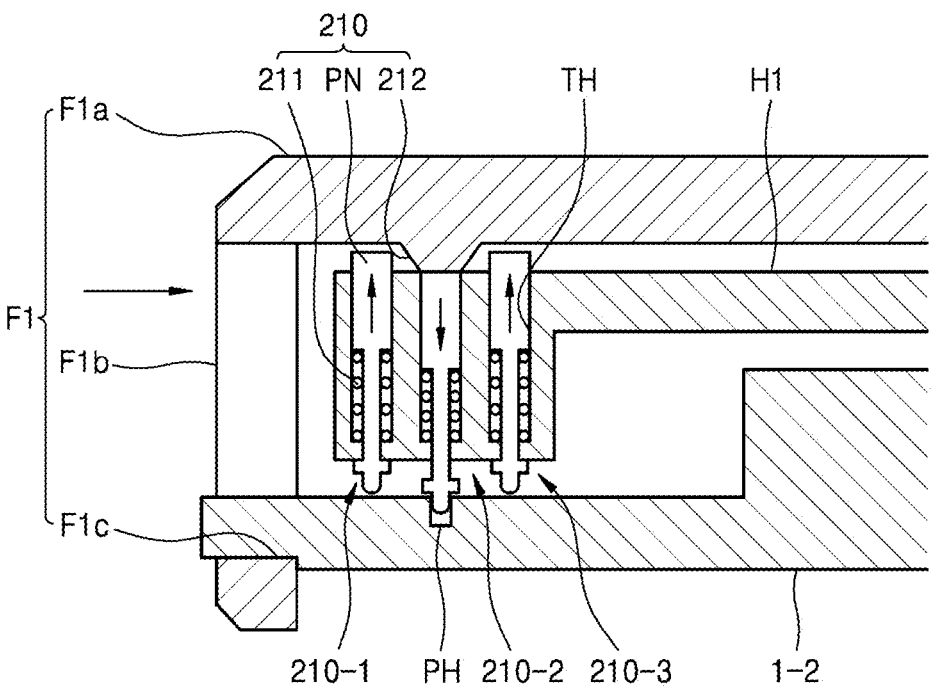
FIG. 13 is a cross-sectional view showing a clamped state of a medium-diameter probe card in the probe card test system of FIG. 1.
Figure 14:
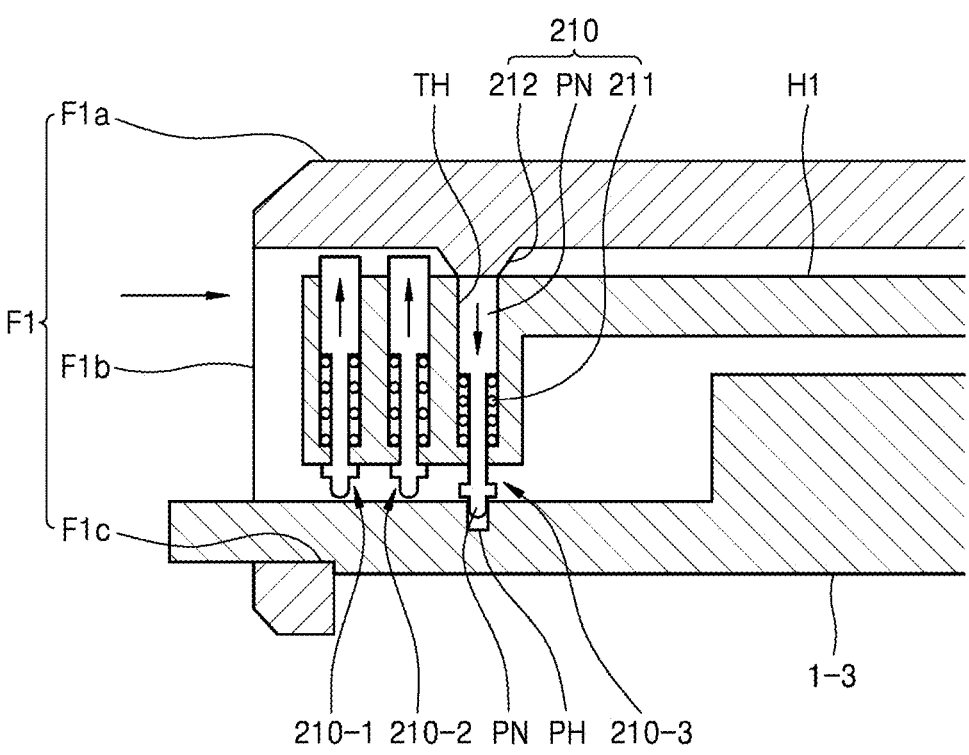
FIG. 14 is a cross-sectional view showing a clamped state of a large-diameter probe card in the probe card test system of FIG. 1.

FIG. 12 is a cross-sectional view showing a clamped state of a small-diameter probe card 1-1 in the probe card test system 100 of FIG. 1, FIG. 13 is a cross-sectional view showing a clamped state of a medium-diameter probe card 1-2 in the probe card test system 100 of FIG. 1, and FIG. 14 is a cross-sectional view showing a clamped state of a large-diameter probe card 1-3 in the probe card test system 100 of FIG. 1.

As shown in FIG. 12, the pin pusher 210 may include the pin PN provided in a shape corresponding to the pinhole PH provided in the probe card 1 so as to be insertable into the pinhole PH, and provided to move forward or backward through a through-hole TH provided in the first head body H1, an elastic member 211 for applying a restoring force in a direction in which the pin PN moves backward, and a cam protrusion 212 mounted on a surface of the first horizontal portion F1a facing the pin PN so as to press the pin PN forward depending on a position to which the first finger F1 slides.

Therefore, when the cam protrusion 212 slides together with the first horizontal portion F1a to press a rear end of the pin PN, a front end of the pin PN may be inserted into the pinhole PH provided in the probe card 1 so as to align or firmly fix the probe card 1.

To fix probe cards of various diameters, e.g., the small-diameter probe card 1-1 of FIG. 12, the medium-diameter probe card 1-2 of FIG. 13, and the large-diameter probe card 1-3 of FIG. 14, depending on a slide position of the first finger F1, the pin pusher 210 may include a first pin pusher 210-1 mounted at a first slide position, a second pin pusher 210-2 mounted at a second slide position different from the first slide position, and a third pin pusher 210-3 mounted at a third slide position different from the second slide position.

Therefore, as shown in FIG. 12, when the small-diameter probe card 1-1 needs to be clamped, the pin PN of the first pin pusher 210-1 mounted at the first slide position may be inserted into the pinhole PH to firmly clamp the small-diameter probe card 1-1. As shown in FIG. 13, when the medium-diameter probe card 1-2 needs to be clamped, the pin PN of the second pin pusher 210-2 mounted at the second slide position may be inserted into the pinhole PH to firmly clamp the medium-diameter probe card 1-2. As shown in FIG. 14, when the large-diameter probe card 1-3 needs to be clamped, the pin PN of the third pin pusher 210-3 mounted at the third slide position may be inserted into the pinhole PH to firmly clamp the large-diameter probe card 1-3.

Thus, using the probe card test system 100 according to some embodiments of the present invention, the probe cards 1 of various diameters, e.g., the small-diameter probe card 1-1, the medium-diameter probe card 1-2, and the large-diameter probe card 1-3, may be aligned or firmly fixed depending on slide positions of the fingers F1, F2, F3, and F4, thereby reducing test time, test labor, and test cost and significantly increasing test precision and productivity.

Figure 15:
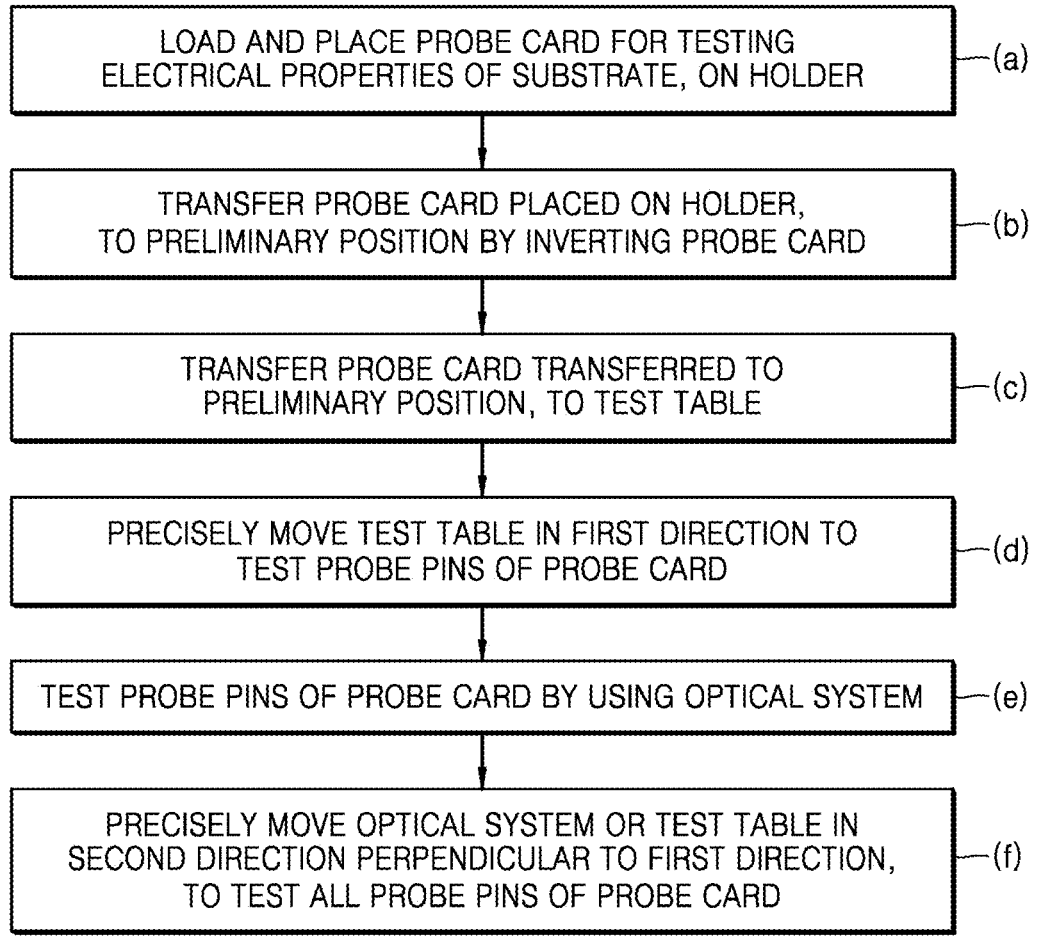
FIG. 15 is a flowchart of a probe card test method according to some embodiments of the present invention.

FIG. 15 is a flowchart of a probe card test method according to some embodiments of the present invention.

As shown in FIGS. 1 to 15, the probe card test method according to some embodiments of the present invention may include (a) loading and placing the probe card 1 for testing electrical properties of a substrate, on the holder 11, (b) transferring the probe card 1 placed on the holder 11 to the preliminary position by inverting the probe card 1, (c) transferring the probe card 1 transferred to the preliminary position, to the test table 41, (d) precisely moving the test table 41 in the first direction I to test the probe pins 2 of the probe card 1, (e) testing the probe pins 2 of the probe card 1 by using the optical system 50, and (f) precisely moving the optical system 50 or the test table 41 in the second direction II perpendicular to the first direction I, to test all the probe pins 2 of the probe card 1.

In step (a), the probe card 1 may be placed on the holder 11 with the probe pins 2 facing downward and, in step (b), the probe card 1 may be inverted such that the probe pins 2 face upward.

In step (c), the probe card 1 may be picked up and transferred to the test table 41 with the probe pins 2 facing upward, in step (d), the probe card 1 may be precisely moved in the X-axis direction and, in steps (e) and (f), the optical system 50 which is precisely moved in the Y-axis direction may test the probe pins 2 of the probe card 1.

Thereafter, the probe card 1 having been completely tested may be reversely transferred and inverted to return to the holder 11 and then unloaded to the outside to wait in the waiting area.

According to the afore-described embodiments of the present invention, a series of test processes may be automated to rapidly and accurately test not only small-diameter but also large-diameter probe cards, a large quantity of probe cards may be tested using a short waiting time of the probe cards stored in a waiting area, so as to prevent defects of probe pins in advance before a wafer test, and probe cards of various diameters may be tested, thereby reducing test time, test labor, and test cost and significantly increasing test precision and productivity. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A probe card test system comprising:

a loader for loading and placing a probe card for testing electrical properties of a substrate, on a holder;

an inverter for transferring the probe card placed on the holder, to a preliminary position by inverting the probe card;

a transferer for transferring the probe card transferred to the preliminary position, to a test table;

a test table mover for precisely moving the test table in a first direction to test probe pins of the probe card;

an optical system for optically testing the probe pins of the probe card; and an optical system mover for precisely moving the optical system or the test table in a second direction perpendicular to the first direction, to test all the probe pins of the probe card.

2. The probe card test system of claim 1, wherein the inverter comprises:

a first clamp head for clamping two sides of the probe card placed on the holder with the probe pins facing downward; and a rotating arm connected to the first clamp head at an end and to a rotating shaft at another end and rotating around the rotating shaft to invert the first clamp head such that the probe pins of the probe card face upward.

3. The probe card test system of claim 2, wherein the first clamp head comprises:

a first head body provided to correspond to the probe card;

a first finger provided to move forward or backward on a portion of the first head body so as to be in contact with a first portion of the probe card; and a second finger provided to move forward or backward on another portion of the first head body so as to be in contact with a second portion of the probe card.

4. The probe card test system of claim 3, wherein the first finger comprises:

a first horizontal portion provided in a shape corresponding to a portion of a top surface of the first head body to slide along the first head body;

a first vertical portion connected to the first horizontal portion to move toward or away from the first portion of the probe card; and a first recessed portion provided in a surface of the first vertical portion facing the probe card and provided in a concave or arc shape to correspond to the first portion of the probe card, and wherein the second finger comprises:

a second horizontal portion provided in a shape corresponding to another portion of the top surface of the first head body to slide along the first head body;

a second vertical portion connected to the second horizontal portion to move toward or away from the second portion of the probe card; and a second recessed portion provided in a surface of the second vertical portion facing the probe card and provided in a concave or arc shape to correspond to the second portion of the probe card.

5. The probe card test system of claim 4, wherein the first clamp head further comprises a pin pusher for pushing a pin toward a pinhole provided in the probe card to fix the probe card, and wherein the pin pusher comprises:

the pin provided in a shape corresponding to the pinhole provided in the probe card so as to be insertable into the pinhole, and provided to move forward or backward through a through-hole provided in the first head body;

an elastic member for applying a restoring force in a direction in which the pin moves backward; and a cam protrusion mounted on a surface of the first horizontal portion facing the pin so as to press the pin forward depending on a position to which the first finger slides.

6. The probe card test system of claim 5, wherein, to fix probe cards of various diameters depending on a slide position of the first finger, the pin pusher comprises:

a first pin pusher mounted at a first slide position; and a second pin pusher mounted at a second slide position different from the first slide position.

7. The probe card test system of claim 4, wherein the transferer comprises:

a second clamp head for clamping other two sides of the probe card transferred to the preliminary position so as not to interfere with the first clamp head of the inverter;

a first movable plate connected to the second clamp head and capable of reciprocating to transfer the second clamp head from the preliminary position to the test table; and a first rail mounted above the second clamp head to guide the first movable plate in the first direction.

8. The probe card test system of claim 7, wherein the second clamp head comprises:

a second head body provided to correspond to the probe card;

a third finger provided to move forward or backward on a portion of the second head body so as to be in contact with a third portion of the probe card; and a fourth finger provided to move forward or backward on another portion of the second head body so as to be in contact with a fourth portion of the probe card.

9. The probe card test system of claim 8, wherein the third finger comprises:

a third horizontal portion provided in a shape corresponding to a portion of a top surface of the second head body to slide along the second head body;

a third vertical portion connected to the third horizontal portion to move toward or away from the third portion of the probe card; and a third recessed portion provided in a surface of the third vertical portion facing the probe card and provided in a concave or arc shape to correspond to the third portion of the probe card, and wherein the fourth finger comprises:

a fourth horizontal portion provided in a shape corresponding to another portion of the top surface of the second head body to slide along the second head body;

a fourth vertical portion connected to the fourth horizontal portion to move toward or away from the fourth portion of the probe card; and a fourth recessed portion provided in a surface of the fourth vertical portion facing the probe card and provided in a concave or arc shape to correspond to the fourth portion of the probe card.

10. The probe card test system of claim 9, wherein a first virtual line which connects the first and second portions of the probe card passes through a center point of the probe card, and wherein a second virtual line which connects the third and fourth portions of the probe card passes through the center point of the probe card perpendicularly to the first virtual line.

11. The probe card test system of claim 10, wherein the first virtual line extends in a direction which is the same as the first direction, and wherein the second virtual line extends in a direction which is the same as the second direction.

12. The probe card test system of claim 6, wherein the transferer further comprises a lift provided between the second clamp head and the first movable plate to raise or lower the second clamp head.

13. The probe card test system of claim 1, wherein the test table mover comprises:

a second movable plate connected to the test table and capable of reciprocating from a first test position to a second test position;

a second rail mounted under the second movable plate to guide the second movable plate in the first direction; and a base for supporting the second rail.

14. The probe card test system of claim 1, wherein the optical system comprises:

a scan test camera for scan-testing the probe pins of the probe card at a low magnification; and a precise test camera disposed next to the scan test camera to precisely test the probe pins, which require a precise test, at a high magnification.

15. The probe card test system of claim 14, wherein the precise test camera is at least partially raised or lowered to move a focus.

16. The probe card test system of claim 1, wherein the optical system mover comprises:

a third movable plate connected to the optical system and capable of reciprocating from a first imaging position to a second imaging position;

a third rail for guiding the third movable plate in the second direction; and a base for supporting the third rail.

17. The probe card test system of claim 1, wherein the holder substantially has a ring shape or a short pipe shape with a hollow to protect the probe pins provided on a bottom surface of the probe card.

18. The probe card test system of claim 1, wherein the loader is a loader/unloader for unloading the probe card which has been completely tested and returned to the holder through the transferer and the inverter.

19. A probe card test method comprising:

(a) loading and placing a probe card for testing electrical properties of a substrate, on a holder;

(b) transferring the probe card placed on the holder, to a preliminary position by inverting the probe card;

(c) transferring the probe card transferred to the preliminary position, to a test table;

(d) precisely moving the test table in a first direction to test probe pins of the probe card;

(e) testing the probe pins of the probe card by using an optical system; and (f) precisely moving the optical system or the test table in a second direction perpendicular to the first direction, to test all the probe pins of the probe card.

20. A probe card test system comprising:

a loader for loading and placing a probe card for testing electrical properties of a substrate, on a holder;

an inverter for transferring the probe card placed on the holder, to a preliminary position by inverting the probe card;

a transferer for transferring the probe card transferred to the preliminary position, to a test table;

a test table mover for precisely moving the test table in a first direction to test probe pins of the probe card;

an optical system for optically testing the probe pins of the probe card; and an optical system mover for precisely moving the optical system or the test table in a second direction perpendicular to the first direction, to test all the probe pins of the probe card, wherein the inverter comprises:

a first clamp head for clamping two sides of the probe card placed on the holder with the probe pins facing downward; and a rotating arm connected to the first clamp head at an end and to a rotating shaft at another end and rotating around the rotating shaft to invert the first clamp head such that the probe pins of the probe card face upward, wherein the first clamp head comprises:

a first head body provided to correspond to the probe card;

a first finger provided to move forward or backward on a portion of the first head body so as to be in contact with a first portion of the probe card; and a second finger provided to move forward or backward on another portion of the first head body so as to be in contact with a second portion of the probe card, wherein the first finger comprises:

a first horizontal portion provided in a shape corresponding to a portion of a top surface of the first head body to slide along the first head body;

a first vertical portion connected to the first horizontal portion to move toward or away from the first portion of the probe card; and a first recessed portion provided in a surface of the first vertical portion facing the probe card and provided in a concave or arc shape to correspond to the first portion of the probe card, wherein the second finger comprises:

a second horizontal portion provided in a shape corresponding to another portion of the top surface of the first head body to slide along the first head body;

a second vertical portion connected to the second horizontal portion to move toward or away from the second portion of the probe card; and a second recessed portion provided in a surface of the second vertical portion facing the probe card and provided in a concave or arc shape to correspond to the second portion of the probe card, wherein the first clamp head further comprises a pin pusher for pushing a pin toward a pinhole provided in the probe card to fix the probe card, wherein the transferer comprises:

a second clamp head for clamping other two sides of the probe card transferred to the preliminary position so as not to interfere with the first clamp head of the inverter;

a first movable plate connected to the second clamp head and capable of reciprocating to transfer the second clamp head from the preliminary position to the test table; and a first rail mounted above the second clamp head to guide the first movable plate in the first direction, wherein the transferer further comprises a lift provided between the second clamp head and the first movable plate to raise or lower the second clamp head, wherein the test table mover comprises:

a second movable plate connected to the test table and capable of reciprocating from a first test position to a second test position;

a second rail mounted under the second movable plate to guide the second movable plate in the first direction; and a base for supporting the second rail, wherein the optical system comprises:

a scan test camera for scan-testing the probe pins of the probe card at a low magnification; and a precise test camera disposed next to the scan test camera to precisely test the probe pins, which require a precise test, at a high magnification, wherein the optical system mover comprises:

a third movable plate connected to the optical system and capable of reciprocating from a first imaging position to a second imaging position;

a third rail for guiding the third movable plate in the second direction; and a base for supporting the third rail, and wherein the holder substantially has a ring shape or a short pipe shape with a hollow to protect the probe pins provided on a bottom surface of the probe card.

* * * * *